United States Patent [19]

Vig

[11] 4,375,604
[45] Mar. 1, 1983

[54] METHOD OF ANGLE CORRECTING DOUBLY ROTATED CRYSTAL RESONATORS

[75] Inventor: John R. Vig, Colts Neck, N.J.

[73] Assignee: The United States of America as represented by the Secretary of the Army, Washington, D.C.

[21] Appl. No.: 238,895

[22] Filed: Feb. 27, 1981

[51] Int. Cl.³ ............................................. H01L 41/08
[52] U.S. Cl. .................................... 310/312; 310/361; 310/369; 29/25.35
[58] Field of Search ....................... 310/312, 361, 369; 29/29.35

[56] References Cited

U.S. PATENT DOCUMENTS

| 2,159,796 | 5/1939 | Hawk | 310/361 |
| 2,486,916 | 11/1949 | Bottom | 310/369 |
| 3,097,315 | 7/1963 | Shinada et al. | 310/369 X |
| 3,979,614 | 9/1976 | Toyoda | 310/369 X |
| 4,050,126 | 9/1977 | Ikeno et al. | 310/312 X |
| 4,070,502 | 1/1978 | Vig et al. | 310/312 X |
| 4,188,557 | 2/1980 | Mattuschka | 310/369 X |
| 4,262,227 | 4/1981 | Ikeno et al. | 310/312 |

FOREIGN PATENT DOCUMENTS 2828048  1/1979  Fed. Rep. of Germany ...... 310/312

Primary Examiner—Mark O. Budd
Attorney, Agent, or Firm—Nathan Edelberg; Jeremiah G. Murray; Edward Goldberg

[57] ABSTRACT

Doubly rotated quartz crystal blanks such as the SC, IT and FC cuts have their apparent angles of cut and hence their frequency vs. temperature characteristics modified by changing the contours of one or both of the convex sides thereof, or by changing the electrode areas thereof; or a combination of these two changes.

13 Claims, 5 Drawing Figures

METHOD OF ANGLE CORRECTING DOUBLY ROTATED CRYSTAL RESONATORS

The invention described herein may be manufactured and used by or for the Government without the payment of any royalty thereon.

BACKGROUND OF THE INVENTION

This invention relates in general to a method of treatment of quartz crystal resonators for varying the frequency vs. temperature (f vs. T) characteristics thereof in a desired manner. More particularly, the invention relates to a method of treating SC-cut quartz resonator blanks, or other doubly rotated cuts, in such a way that a desired f vs. T characteristic can be achieved. Unmodified resonator blanks of these types will inherently have a certain variation in f vs. T characteristic due to the inherent errors in the cutting machinery and due to variations introduced during lapping. The novel method of the invention permits all of these randomly varying blanks to be converted to the same characteristic, within an acceptable tolerance, or each to different desired characteristics.

The invention is based on the discovery that the f vs. T characteristic of the c-mode of SC-cut quartz resonators and of other doubly rotated cuts is a function of the curvature or diopter value of the convex side thereof and of the electrode area. By changing this diopter value and/or the electrode area, the slope of the f vs. T characteristic at its point of inflection, as well as the turning points thereof can be controlled in a predictable manner. These changes in diopter value and/or electrode area thus effectively change the effective angles of cut of the crystals and thus provides a relatively easy and inexpensive way of increasing the useability of crystal blanks which might otherwise have to be discarded or modified by other more costly methods. The diopter value, D, is a measure of the curvature of the convex side of these resonator blanks and is equal to the reciprocal of the radius of curvature in meters. The units of all of the slopes referred to herein is ppm/°C.

SUMMARY OF THE INVENTION

The invention comprises a method for modifying the f vs. T characteristic of a plano-convex, fundamental mode, SC-cut quartz crystal resonator to have a new slope, $df/dT|_{D_f}$ at its point of inflection, comprising the steps of; measuring the f vs. T characteristic of such a resonator having an initial diopter value $D_i$, determining from said f vs. T characteristic the slope, $df/dT|_{D_i}$, at its point of inflection, determining from the following formula the diopter value, $D_f$, required to yield said new slope;

$$D_f = \frac{\frac{df}{dT}\bigg|_{D_i} - \frac{df}{dT}\bigg|_{D_f} + 0.216 D_i}{0.216}$$

and then re-contouring the convex side of said resonator to the calculated new diopter, $D_f$.

For third and higher overtone blanks of this type, and for biconvex blanks, and for other doubly rotated cuts, the procedure is similar but the coefficient 0.216 in the formula is different for the different blank types.

In a variation of this concept, the characteristics of such blanks can be modified by means of the aforementioned diopter value change to achieve an approximation of the desired characteristic, and then the electrode area of the blank can also be changed to fine tune the f vs. T characteristic to the desired value, or if the initial diopter value is fairly close to the desired one, electrode area change alone can be used.

Figure 1:
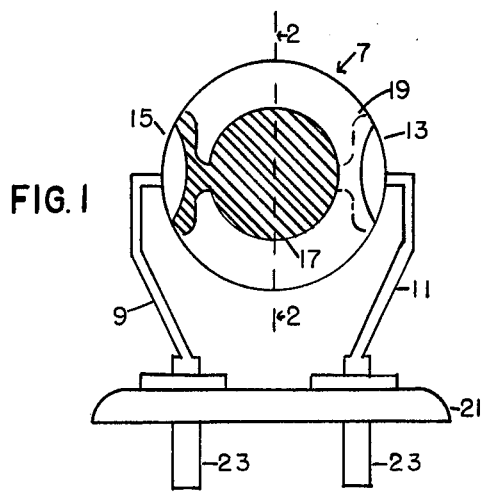
FIGS. 1 and 2 are front and side sectional views of a resonator which has been modified according to the present invention.

The f vs. T characteristic of a resonator is a graph showing how the frequency thereof varies with the resonator temperature.

DETAILED DESCRIPTION OF A PREFERRED EMBODIMENT

A doubly rotated cut resonator blank is one which is cut at an angle $\phi$ rotated around the Z-axis of the mother crystal and at an angle $\theta$ around the X'-axis thereof. Doubly rotated crystal resonators, such as the SC-cut, have significant advantages over singly rotated resonators such as the AT-cut. One of these advantages is the lack of a thermal transient effect, which means that the warmup time of oven-controlled SC-cut crystals can be much shorter than with singly rotated crystals in which thermal gradients during warmup cause long warmup times. Also, SC-cut resonators can exhibit low drive level effect, and little frequency error due to such things as electrode stress relief, vibration and gravitational forces.

In order to exhibit the aforementioned advantages, doubly rotated crystal blanks must be accurately cut at the proper angles of $\phi$ and $\theta$. Inherent tolerances of the mechanical cutting machinery and of lapping processes make this impossible to achieve in practice except with a very small yield. Techniques are known for economically correcting inaccurate angles of cut of singly rotated blanks such as the AT-cut. This involves such things as regrinding the planar surfaces of the blanks to physically change the angle of cut to a desired value. This is feasible because with singly rotated cuts, generally available x-ray diffraction equipment can be used to measure the actual angle of cut and thus the amount of angular error is easily determined. Further, only one angle, the angle $\theta$, needs to be corrected. High precision x-ray diffraction techniques are not as yet economically feasible for the doubly rotated cuts. Moreover, for the doubly rotated cuts, both the angles $\phi$ and $\theta$ must be accurately controlled. The degree of control, especially of the angle $\theta$, must be much tighter, particularly when making crystals for oven-controlled oscillators. The tight angle tolerances, and the lack of an inexpensive technique for correcting angles of cut of such resonators has limited the application of these cuts. Without an angle correction technique, it is impossible to tailor the frequency vs. temperature characteristics of the doubly rotated resonators to a desired value.

Prior art techniques for correcting actual or apparent angles of cut are shown in, for example, U.S. Pat. No. 4,070,502, issued May 5, 1976, which describes a method for changing the apparent angle of cut of singly rotated resonators by depositing an adherent film thereon. Temperature changes cause the film to exert stresses on the resonator which affects the f vs. T characteristic in a desired manner. An article by Husgen et al entitled "A Method of Angle Correction" in the "1976 Proceedings of the 30th Annual Symposium on Frequency Control" describes a method of actual angle change including etching away selected portions of a resonator blank followed by lapping to a final configuration. U.S. Pat. No. 3,803,774, issued on Dec. 22, 1972 shows another method of changing actual angles of cut involving forming one or more mesas on an inaccurately cut resonator, followed by double face lapping until the desired angle is reached.

Figure 3:
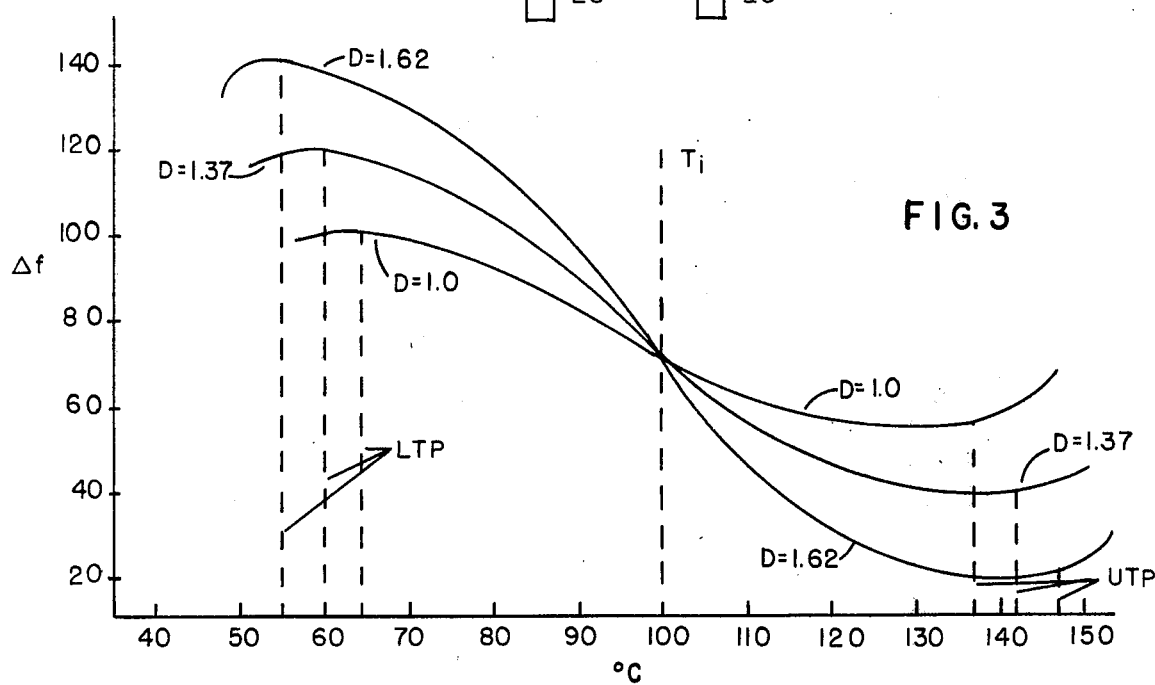
FIGS. 3, 4, and 5 show the frequency vs. temperature characteristics of three different resonator blanks which have been modified with the methods of the present invention, and showing the points of inflection and the upper and lower turning points.

The frequency vs. temperature characteristic of most crystal resonators follows a third order law, as shown in FIG. 3, in which the abscissa is T and the ordinate is the change in frequency from some nominal value, Δf. The maxima and minima of the curves are the lower and upper turning points, respectively. These points of zero slope are preferred as the operating points of the crystal ovens of oven-controlled oscillators. Approximately halfway between the upper and lower turning points is the point of inflection. The point of inflection of SC-cut crystals is approximately 100° C., the exact value depending on the overtone. With the method of the present invention, f vs. T characteristics of SC-cut and other doubly rotated crystals can be changed simply by re-contouring the convex side thereof to a new diopter value while leaving the flat side unchanged. This new value will shift both the upper and lower turning points and change the slope at the point of inflection. In fact the slope at the point of inflection has been found to be a linear function of the change in diopter value. With the technique of the present invention it is possible to obtain a zero slope, or any other desired slope at the point of inflection. A zero slope is desirable because then there is a large temperate range about this point in which a temperature excursion results in a nearly zero change in frequency. Such an operating point is advantageous for many applications, particularly for oven-controlled oscillators. Further, the operating temperature of an oven-controlled crystal must always be above the ambient temperature so that the crystal always loses heat to its surroundings. The present invention makes it possible to raise the lower turning point of a crystal to near the inflection point for such applications.

Furthermore, adjusting the contour of an SC-cut crystal resonator can produce a significant shift in f vs. T characteristic, while producing only insignificant shifts in the other resonator parameters. For example, for 14 mm diameter fundamental mode plano-convex 5 MHz resonators, changing the contour from 1 diopter to 3 diopter changed the slope at the inflection temperature by 0.432 ppm per °C. The resonator Q's remained in the range of 1 million, no activity dips were observed, the capacitance ratios increased from about 1200 at 1 diopter to about 1800 at 3 diopter, the anharmonic modes between the b-mode and c-mode remained at a much higher resistance than the c-mode resistance, and the closest to the c-mode anharmonic mode moved from being 120 kHz from the c-mode at 1 diopter to about 190 kHz from the c-mode at 3 diopter.

Figure 2:
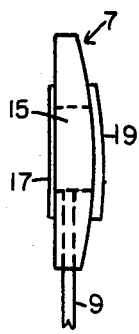

The mounted resonator blank 7 of FIG. 1 is of the plano-convex type which is generally of disc shape with one side thereof flat and the other side convex. The cross sectional view of FIG. 2 illustrates the shape of the sides. Electrodes, which usually are gold, are attached to opposite sides of the resonator for making electrical connection thereto. The electrode 17 is applied to the flat resonator side and electrode 19 to the convex one. The electrode 17 makes contact with conductive contact 15 and mounting clip 9 and the electrode 19 with contact 13 and clip 11 at diametrically opposite points on the resonator blank. The clips connect with pins 23 which are supported by base 21.

FIG. 3 shows how the present invention was used to modify the frequency vs. temperature characteristics of a fundamental mode, plano-convex SC-cut resonator blank having nominal angles of cut of; $\phi = 21°56'$ and $\theta = 33°44'$ by simply re-contouring the convex face to a new diopter value. This blank was originally cut with a diopter value of 1.0 and the measured f vs. T characteristic of this blank is labelled as D=1.0 in FIG. 1. It can be seen that this curve has a lower turning point (LTP) of approximately 64° C., and an upper turning point (UTP) of approximately 137° C. This same blank was then re-contoured to have diopter values of D=1.37 and D=1.62 by the simple expedient of grinding the convex surfaces thereof to the new curvature corresponding to these diopter values. After each such re-contouring, the f vs. T characteristic was re-measured. The results are plotted in FIG. 3 by means of the curves labelled D=1.37 and D=1.62. It can be seen that the point of inflection, $T_i$, of all of these curves is the same and is about 100° C. Also, as the diopter value increases, the lower turning point is lowered and the upper turning point is raised. Also, the slope at the point of inflection becomes stepper, i.e., more negative, as the diopter value increases.

Figure 4:
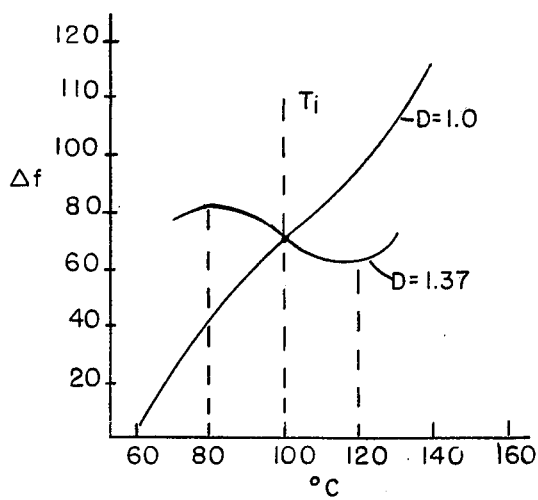

FIG. 4 shows the characteristics of a similar blank which had an initial diopter value of D=1.0. The nominal angles of cut of this blank were $\phi = 21°56'$ and $\theta = 33°38'$. This blank showed no turning points but when it was re-contoured to D=1.37 it showed definite turning points at about 80° C. and 120° C., as shown.

It has been found empirically that the following linear relationship exists between the diopter values and the inflection point slopes for the c-mode of fundamental mode, SC-cut, plano-convex resonator blanks with nominal frequencies of approximately 5.0 MHz;

$$\left.\frac{df}{dT}\right|_{D_f} = \left.\frac{df}{dT}\right|_{D_i} - 0.216(D_f - D_i) \quad \text{Eq. (1)}$$

wherein $df/dT|_{D_i}$ is the inflection point slope at the initial diopter value, $D_i$, and $df/dT|_{D_f}$ is the inflection point slope at the final diopter value, $D_f$. The units of the slopes in this equation are ppm per °C., i.e., for $D_f - D_i = 1.0$ diopter, $df/dT|_{D_f}$ will be 0.216 ppm per °C. lower than $df/dT|_{D_i}$. If it is desired to determine the final diopter value, $D_f$, required to yield a desired inflection point slope, Eq. (1) can be solved for $D_f$, as follows:

$$D_f = \frac{\left.\frac{df}{dT}\right|_{D_i} - \left.\frac{df}{dT}\right|_{D_f} + 0.216 D_i}{0.216} \quad \text{Eq. (2)}$$

Figure 5:
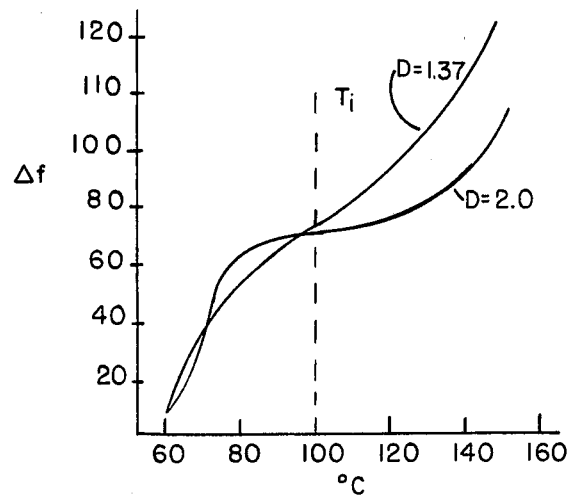

The curves of FIG. 5 show how this technique can be used to obtain a zero slope at the point of inflection, with the advantages explained above. The curve labelled D=1.37 therein represents the curve of a resonator initially cut with a diopter value of $D_i$ of 1.37. The measured slope at the inflection point of this curve was found to be 0.124 ppm/C.°. It was desired to shift this slope to zero and Eq. (2) was utilized to yield the required final diopter value $D_f$. This was found to be $D_f = 1.94$. A standard 2.0 diopter cup was used to re-contour this blank. The re-contoured blank showed the f vs. T curve labelled as $D=2.0$ in FIG. 5. It can be seen that this curve has a nearly zero slope at $T_i$, and remains at near zero slope over a wide temperature range about $T_i$.

It has also been found that the c-modes of 5 MHz, third overtone SC-cut resonators have a linear relationship between diopter value and inflection point slope. This relationship is as follows:

$$\left.\frac{df}{dT}\right|_{D_f} = \left.\frac{df}{dT}\right|_{D_i} - 0.035(D_f - D_i) \quad \text{Eq. (3)}$$

This equation was derived by measuring the f vs. T characteristics of a group of six 5 MHz, third overtone SC-cut resonators, all initially cut to 4.0 diopters, plano-convex, with 14 mm diameters. The blanks were all then re-contoured to higher and lower diopters, in 1.0 diopter steps. The measured change in the inflection point slope at these steps were used to derive Eq. (3). Eq. (3) can be solved for the final diopter value, $D_f$, as follows:

$$D_f = \frac{\left.\frac{df}{dT}\right|_{D_i} - \left.\frac{df}{dT}\right|_{D_f} + 0.035 D_i}{0.035} \quad \text{Eq. (4)}$$

In a modification of this method, the f vs. T characteristic can be modified by a combination of the aforementioned re-contouring of the blank and modifying the electrode area of the blank. It has been found that the f vs. T characteristic of quartz resonator blanks can be affected to a certain degree by changing the electrode area. This provides and alternative way of fine tuning crystal characteristics. The diopter cups used in re-contouring can be purchased in one eighth diopter increments, and electrode area modification provides a convenient way of fine tuning which would otherwise require the use of non-standard diopter cups. For example, it has been found that when the 7 mm diameter circular electrodes of a 14 mm diameter SC-cut fundamental mode resonator were replaced with 4 mm electrodes, the slope of the f vs. T characteristic at the inflection point changed from $+1.07 \times 10^{-8}$ per °C. to $-1.25 \times 10^{-8}$ per °C., i.e., the change in slope was slightly less than the change that would have been produced by a one eighth diopter increase in contour. According to Eq. (1), a one eighth diopter change in contour produces a $2.7 \times 10^{-8}$ per °C. change in slope vs. a $2.3 \times 10^{-8}$ per °C. change produced by decreasing the electrode diameter from 7 mm to 4 mm. Of course, to produce a smaller change in slope, one can make a smaller change in electrode dimensions. The change in electrode dimensions can be used alone to produce relatively small changes in f vs. T characteristics, or the method can be used in combination with changing the contour and thereby produce large but precisely controlled changes in f vs. T characteristics.

It has also been found that the method can be applied to biconvex blanks. The f vs. T characteristic of a biconvex resonator can be shifted by re-contouring either one or both sides of the blank. The method can also be applied to other doubly rotated cuts, such as the IT and FC-cuts, however, the proportionality constant in equation (1) will be different for different types of resonators. The proportionality constant for any desired cut or any particular doubly rotated design can be conveniently determined by performing a simple experiment similar to that described above following equation (3) for 5 MHz, third overtone SC-cut resonators.

While the invention has been described in connection with specific and illustrative embodiments, obvious variations will occur to those skilled in the art, accordingly the invention should be limited only by the scope of the appended claims.

I claim:

1. A method for modifying the frequency vs. temperature characteristic of a quartz crystal resonator blank having at least one convex surface of contour $D_i$, to have a new slope, $df/dT|_{D_f}$, at the point of inflection, comprising the steps of:
   (A) measuring the frequency vs. temperature characteristic of the blank with contour $D_i$.
   (B) determining from said frequency vs. temperature characteristic the slope, $df/dT|_{D_i}$ at the point of inflection,
   (C) determining from the following formula the diopter value, $D_f$, required to yield the desired new slope, $df/dT|_{D_f}$ at the point of inflection, $$D_f = \left.\frac{df}{dT}\right|_{D_i} - \left.\frac{df}{dT}\right|_{D_f} + P_{fT} D_i$$

wherein $p_{fT}$ is the measured value of the change in inflection point slope for a unit step change in diopter value,
   (D) then re-contouring at least one convex side of said blank to the calculated new diopter value, $D_f$.

2. The method of claim 1 further including the step of fine tuning said frequency vs. temperature characteristic to the precise desired value by modifying the electrode area of said crystal resonator.

3. The method of increasing or decreasing the slope at the point of inflection of the frequency vs. temperature curve of a plano-convex SC-cut resonator blank, comprising the step of changing the diopter value of the convex surface of said blank until the desired slope at the point of inflection is reached.

4. A method for modifying the frequency vs. temperature characteristic of the c-mode of a plano-convex, fundamental mode, SC-cut quartz crystal resonator blank of contour $D_i$, to have a new slope, $df/dT|_{D_f}$ at the point of inflection, comprising the steps of;
   (A) measuring the frequency vs. temperature characteristic of the blank with the contour $D_i$,
   (B) determining from said frequency vs. temperature characteristic the slope, $df/dT|_{D_i}$, at the point of inflection,
   (C) determining from the following formula the diopter value, $D_f$, required to yield the desired new slope, $df/dT|_{D_f}$ at the point of inflection, $$D_f = \frac{\left.\frac{df}{dT}\right|_{D_i} - \left.\frac{df}{dT}\right|_{D_f} + 0.216 D_i}{0.216}$$

(D) then re-contouring the convex side of said blank to the calculated new diopter value, $D_f$.

5. A method for modifying the frequency vs. temperature characteristic of the c-mode of a plano-convex, third overtone, SC-cut quartz crystal resonator with an initial contour of $D_i$ diopters, to have a new slope $df/dT|_{Df}$ at the point of inflection, comprising the steps of;
   (A) determining the frequency vs. temperature characteristic of the resonator at its initial contour, $D_i$,
   (B) determining from said frequency vs. temperature characteristic the slope, $df/dT|_{Di}$, at the point of inflection.
   (C) determining from the following formula the diopter value, $d_f$, required to yield the desired new slope, $df/dT|_{Df}$ at the point of inflection, $$D_f = \frac{\frac{df}{dT}\bigg|_{D_i} - \frac{df}{dT}\bigg|_{D_f} + 0.035 D_i}{0.035}$$

(D) then re-contouring the convex side of said blank to the calculated new diopter value, $D_f$.

6. The method of changing the frequency vs. temperature characteristic and the slope at the point of inflection thereof of an SC-cut or other doubly rotated crystal resonator, comprising the steps of measuring the frequency vs. temperature characteristic of said resonator with an electrode of a given area or diameter thereon, then reducing said area or diameter to yield a more negative slope at said point of inflection.

7. The method of modifying the frequency vs. temperature characteristic of a plano-convex doubly rotated crystal resonator to obtain a predetermined slope at the point of inflection, comprising the steps of: modifying said characteristic by changing the contour of the convex side of said resonator to obtain the predetermined slope at the point of inflection, and then fine tuning said characteristic to the precise desired value by modifying the electrode area of said crystal resonator.

8. The method of modifying the slope at the point of inflection of the frequency vs. temperature of a biconvex crystal resonator, comprising the steps of: determining frequency vs. temperature characteristic of said resonator with its initial contours, and then re-contouring one or both of said convex sides of said resonator until a desired slope at the point of inflection of the frequency vs. temperature characteristic is achieved.

9. The method of modifying the slope at the point of inflection of the characteristic curve of IT and FC cut doubly rotated crystal resonators of the plano-convex or biconvex types, comprising the steps of re-contouring one or both sides of said resonators to a different diopter value to establish a predetermined slope at the point of inflection of the characteristic curve.

10. An SC-cut crystal resonator of the plano-convex type which has been tailored to have a desired frequency vs. temperature characteristic by re-contouring the convex side thereof to a diopter value of $D_f$, in accordance with the following formula;

$$D_f = \frac{\frac{df}{dT}\bigg|_{D_i} - \frac{df}{dT}\bigg|_{D_f} + 0.216 D_i}{0.216}$$

wherein $df/dT|_{Di}$ is the slope at the point of inflection in ppm/C.° at the initial diopter value, $D_i$, and $df/dT|_{Df}$ is the desired slope at said point of inflection at diopter value $D_f$ in the same units.

11. An SC-cut crystal resonator having a frequency-temperature characteristic including a predetermined slope at the point of inflection thereof for operation in its fundamental mode, comprising a generally disc-shaped resonator with one side thereof flat and the other convex and circular electrodes attached to each of said sides, said resonator having a predetermined contour of the convex side and a predetermined electrode area to obtain a frequency vs. temperature characteristic having a desired slope at the point of inflection thereof.

12. A crystal resonator having at least one convex surface which has been modified to have a desired frequency vs. temperature characteristic by re-contouring at least one convex surface thereof to a diopter value of D, in accordance with the following formula:

$$D_f = \frac{df}{dT}\bigg|D_i - \frac{df}{dT}\bigg|D_f + P_{fT}D_i$$

wherein $df/dT|_{Di}$ is the slope at the point of inflection in ppm/C.° degrees at the initial diopter value, $D_i$, $df/dT|_{Df}$ is the desired slope at said point of inflection at diopter value $D_f$ in the same units; and $P_{fT}$ is the measured value of the change in inflection point slope for a unit step change in diopter value.

13. The crystal resonator as defined in claim 12 which has been further modified by changing the electrode area of said crystal resonator.

* * * * *